United States Patent [19]

Foster et al.

[11] Patent Number: 4,861,641

[45] Date of Patent: Aug. 29, 1989

[54] SUBSTRATES WITH DENSE METAL VIAS

[75] Inventors: Brian C. Foster, Sutton; Roger S. Lind, Acton, both of Mass.

[73] Assignee: Ceramics Process Systems Corporation, Cambridge, Mass.

[21] Appl. No.: 53,323

[22] Filed: May 22, 1987

[51] Int. Cl.$^4$ ............... B32B 3/10; B22F 7/00; H01B 1/02
[52] U.S. Cl. ............... 428/137; 428/209; 428/210; 428/426; 428/432; 428/901; 106/1.12; 106/1.27; 252/515; 252/518; 73/245
[58] Field of Search ............ 428/137, 209, 210, 426, 428/432, 901; 106/1.12, 1.21, 1.24, 1.27, 1.28; 75/233, 245, 235, 248; 252/508, 513, 514, 515, 518

[56] References Cited

U.S. PATENT DOCUMENTS

| | | | |
|---|---|---|---|
| 3,537,888 | 11/1970 | Schwyn | 427/377 X |
| 3,637,435 | 1/1972 | Schwyn et al. | 427/123 |
| 4,289,719 | 9/1981 | McIntosh et al. | 264/86 |
| 4,340,618 | 7/1982 | Fury et al. | 427/96 |
| 4,464,420 | 8/1984 | Taguchi et al. | 427/101 |
| 4,485,150 | 11/1984 | Tsuno | 428/472 X |
| 4,684,446 | 8/1987 | Charles et al. | 427/96 |

Primary Examiner—Ellis P. Robinson
Assistant Examiner—Patrick J. Ryan
Attorney, Agent, or Firm—Bradley N. Ruben

[57] ABSTRACT

Dense vias may be made with a metallizing composition containing tungsten, alumina, and either nickel or palladium. Further, an infiltration process ensures that vias in ceramic substrates are heremetic. Infiltrating materials, including metals and alloys, are applied to co-fired substrates and the composite is fired. The process may be repeated if necessary. Alternatively, the via holes may be bore-coated prior to infiltrating.

24 Claims, No Drawings

SUBSTRATES WITH DENSE METAL VIAS

FIELD OF THE INVENTION

This invention relates to a process for forming conductive vias in a thin film or thick film substrate, and in particular, for forming dense vias having a low resistance and a narrow distribution of resistance values and having a high thermal conductance. The vias may also be made hermetic.

BACKGROUND

Substrates for electronic circuitry are one of the most important applications for high performance ceramics in the microelectronics industry. The circuits are applied using thick film and thin film techniques. In the case of single layer substrates, conductors and other components (resistors, capacitors, etc.,) are applied to the top and bottom of such substrates, with conductive vias through the substrate connecting the top and bottom circuitry. The property requirements for vias in thick film hybrid circuits are generally not difficult to meet; however, because of the high performance and high costs associated with thin film hybrids, the circuitry, including the vias, have stringent property requirements and must be fabricated with precision. The art in circuit fabrication using thin film technology is well established, yet important problems have persisted in the fabrication of vias.

Vias are formed in thin film substrates, which are typically greater than 99.5% alumina, by "drilling" a hole in the substrate, coating the inside of the hole with a thin layer of metal using lithography, vapor deposition methods, and plating processes. Because of the small tolerances (typically less than or equal to 2.0 mil/inch) in the hole position required for thin film processing, laser drilling of the via holes is commonly practiced. Although precise hole position is possible with laser systems, many problems are associated with this method. First, slag and other defects, such as microcracks, are often generated on the substrate around the via holes; these defects can degrade the adhesion and quality of the subsequently applied thin film metallurgy. Second, reproducible, high quality metallization of laser drilled holes is difficult to achieve. Thus, the distribution of resistance values may be unacceptably broad, thereby resulting in low process yields. Third, residual stresses around via holes generally remain in the substrate through subsequent processing. These stresses can be sufficiently large to cause fracture of the substrate during subsequent assembly operations, particularly during soldering. If this occurs in the final assembly steps of an electronic subsystem, the yield losses can be very costly. Although the stresses may be reduced by heat treating laser drilled substrates prior to metallizing, the product quality is still suboptimal.

Lower cost, and potentially higher yield methods have been investigated in recent years. One example is the fabrication of prepunched thin film substrates. Thin film substrates are generally fabricated using a doctor blade process to form green ceramic tape comprising a binder and ceramic powders. This flexible tape is cut into sheets and fired to obtain a dense ceramic substrate. Prepunched substrates are formed by punching holes into the green sheets prior to firing using hard tooling or a numerically controlled punch press.

Extreme care is required during tape processing to minimize the introduction of surface defects on the final substrate. The manufacturing of defect-free, smooth substrates suitable for thin film applications is a difficult task, and becomes even more difficult when via holes are punched into the green tape. Yet, the quality of such holes is sufficient to allow significant cost reduction and yield improvements in subsequent metallizing. However, the application of the prepunched via method is limited by the poor accuracy in the position of via holes in fired substrates. The current art in tape technology generally provides position tolerances in the range of plus-or-minus 0.3 to 1.0% (3–10 mil/inch) because of the variabilities in shrinkage during the firing of such tape.

Accordingly, there is a need for methods of producing high quality thin film substrates having metallized vias, in which the vias have lower resistance and a more uniform distribution of resistivities. The methods should allow higher yields and lower fabrication costs and should also leave minimal residual stress in the substrates. There is also a need for substrates having dense vias which provide for higher thermal conductance than currently produced substrates. Hermeticity of the vias is desired for certain applications; this is not possible using current art in thin film techniques to metallize vias. Finally, it would be desirable to develop methods which would also be applicable to thick film substrates.

One proposed approach has been the co-firing of conductor-filled vias with the green ceramic tape. Via holes are punched in the tape and filled with thick film conductor ink using screen printing, followed by cofiring at high temperatures (1500°–1650° C.) in a reducing atmosphere. This method is possible for thick film substrates, generally fabricated from 90–96% $Al_2O_3$ substrates; however, current art metallurgy limits electrical and thermal conductance. Furthermore, little success has been demonstrated with cofired vias in substrates comprising greater than 99.0% alumina. The primary reason for failure, or at best very limited success, has been the inadequacy of the applied metallization technology. High resistivities (greater than about $6.7 \times 10^{-3}$ ohm-centimeter) and low thermal conductivities are generally observed because of the high level of porosity (about 20 to 40%) in the metal or other nonmetallic phase (such as glass). As a result, hermeticity of vias has also not been possible. In addition, the technology for shrinkage tolerances required during cofiring to allow high yields of substrates having precisely positioned vias (tolerance less than plus-or-minus 0.2% required) is not widely available.

DISCLOSURE OF THE INVENTION

We have discovered methods for producing dense vias having a low value and uniform distribution of resistivities in thin film substrates. These vias may also be hermetic, thereby eliminating the need for solid metal backplanes or brazed metal tabs and lead frames to achieve hermeticity. Furthermore, the dense vias have a high thermal conductance, thus allowing for designs in which via arrays provide high thermal dissipation for active devices which generate heat. Hence, the present invention provides a substitute for thermally conductive substrate materials such as AlN or BeO, especially as applied to thin film applications. Such vias are possible using three methods disclosed herein. The first method involves metallization compositions which sinter to high densities during co-firing; the second and third methods involve a post-fire infiltration step using either a pure metal or metal alloy.

The ability to successfully fabricate metallized substrates in high yields is first dependent on shrinkage control during the firing of green tape. The present invention employs tape technology which provides small position tolerances by such shrinkage control; said tape technology is the subject of U.S. Pat. No. 4,769,294 which is hereby incorporated herein by reference.

Dense vias formed by cofiring are the result of carefully selected metallization compositions. The metallization must sinter to high densities (approximately at least 80%, but greater than 85% of theoretical is preferred) at temperatures between 1500° and 1600° C. for alumina substrates, although higher temperatures are necessary for AlN or BeO substrates, and have a green-to-fired shrinkage behavior closely matching that for the substrate. The metallization should also have acceptable adherence to the ceramic and have a thermal expansion coefficient closely matching that for the ceramic. Tungsten-based metallization meeting some of these requirements is the subject of pending U.S. application Ser. No. 935,264, filed Nov. 26, 1986, which is hereby incorporated herein by reference; however, further embodiments are disclosed below. Furthermore, the metallization should not contain silicate-based bonding agents, as silica is known to promote grain growth in alumina during sintering.

A preferred embodiment of the present invention for the formation of dense, cofired vias is the range of compositions for the inorganic ink constituents of approximately 85–97% tungsten, 2–8% $Al_2O_3$, and 1–7% nickel or palladium. Small amounts (less than about 2%) of additives, such as cobalt or $Y_2O_3$ may be used to enhance density and/or adhesion of the metal to the ceramic. The preferred range of average particle size for the tungsten and $Al_2O_3$ is approximately 0.5–5.0 microns, where the average particle size of the tungsten can be varied to adjust shrinkage characteristics of the printed metallurgy during co-firing to match those of the substrate. The average particle size for the nickel or palladium, as well as the other minor additives, is preferably between approximately 0.5 and 10 microns. Ink formulations for the constituents are disclosed in the above-cited application Ser. No. 935,264; however, for dense vias the preferred range of solids content in the ink is 35–50 volume percent. These inks are ideally suited for greater than 99% alumina substrates, but they may also be used for other substrates (both thick and thin film) such as $Al_2O_3$-based composites, AlN and BeO. Vias formed by this process have a low electrical resistivity (approximately $4 \times 10^{-3}$ ohm-centimeters).

The infiltration method for producing dense, hermetic vias employs post-fire metallization steps to fill voids and porosity in the cofired metallurgy, thus eliminating the need for more cumbersome methods to achieve hermeticity. Composite substrates produced in accordance with this invention have dense, essentially void-free vias (densities greater than 90% of theoretical) which may exhibit helium leak rates less than $10^{-9}$ cc/sec. The vias have a high thermal conductance and a significantly lower electrical resistivity (generally better than $6 \times 10^{-4}$ and typically about $4 \times 10^{-4}$ ohm-centimeters) and a narrow distribution of resistance values. Furthermore, the infiltrated metals are ductile, and hence may reduce stresses around vias due to thermal expansion mismatch between the ceramic and the metallization.

In accordance with this invention, ceramic substrates may be prepared using conventional tape technology, although tapes fabricated using the aforementioned tape technology of U.S. Pat. No. 4,769,294 are preferred. Vias are punched in the green tape at desired locations and are filled with the selected metal ink. The preferred embodiments utilize either tungsten or molybdenum metallization, but any metal which can be cofired with the chosen substrate may be used. For the infiltration method, the metallization should adhere to the ceramic but should not sinter to a high density during cofiring; continuous, open porosity is preferred. The precise firing temperature and metal composition required to achieve a dense ceramic and porous metal vias depends on the chosen ceramic for the substrate. It is preferred that the peak temperature yield vias having a density between 45 and 80% of theoretical (i.e., 55 to 20% open porosity remains). Alumina is a preferred substrate material, although other ceramic materials may be preferred to impart other desired characteristics to the finished substrate. Furthermore, fine particle size alumina (average diameter less than about 1 micrometer), fired between 1475° and 1550° C., is used in a preferred embodiment. Examples of other preferred substrate materials include, but are not limited to, beryllia, zirconia, alumina-based composites, aluminum nitride, and silicon carbide.

After cofiring, a nickel plating, preferred for W or Mo metallization, may be applied to the substrate to ensure sufficient wetting of subsequently applied metal to the vias. Electroless plating techniques are preferred.

Next, an infiltrating metal is applied to the cofired substrate directly over the tungsten (or other metal) vias. The infiltrating material may be in the form of a solid sheet, a preform, or printable ink. Infiltrating materials may be selected from a wide range of metals and/or alloys, including, but not limited to: nickel, palladium, cobalt, silver, copper, and gold. Some alloys of interest which may be used as infiltrants include: 72 Au/28 Cu, 82 Au/18 Ni, 72 Ag/28 Cu, 80 Au/20 Cu, and 81.5 Au/16.5 Cu/2.0 Ni.

Following the application of the infiltrating material, the composite piece is heated to melt the infiltrant. It is preferred that the heating be above the melting point of the infiltrant and that the heating be accomplished in a non-oxidizing atmosphere to prevent oxidation of the metals. Porosity and small voids present in the vias are removed by means including displacement of the pore space by the molten infiltrant. Sometimes, complete densification of the via is not achieved using this procedure, but this process may be repeated if necessary to ensure the desired density and hermeticity.

Alternatively, vis may be bore-coated with thick film conductor inks containing either tungsten or molybdenum, and fired to form a dense adherent layer within the vias. Subsequent processing (including co-firing and nickel plating) is identical to that described above with respect to infiltrated vias, except that the infiltrating metals are applied inside the bore-metallized via holes. In addition to metals used to infiltrate filled vias, tungsten-nickel-copper mixtures may be applied. Tungsten has a thermal expansion below that of the alumina substrate and, when added to the other metals, produces a composite metal via having thermal expansion characteristics which approach those of the substrate. Thus, large stress-free vias, useful as heat sinks, may be produced from the composite.

*(or molybdenum-)

After dense vias are formed, subsequent lapping and polishing process may be desirable, depending on the specific application.

The invention may be better appreciated with reference to the following examples.

EXAMPLE 1

Tungsten ink containing 43 volume percent solids and having the following solids composition was made in accordance with the above-referenced U.S. patent application Ser. No. 935,264:

| Tunsten | 89 | wt % |
|---|---|---|
| Alumina | 7 | |
| $Y_2O_3$ | 2 | |
| Pd | 2 | |

The ink was screen printed into via holes on an alumina substrate and filed at 1550° C. for 1 hour.

EXAMPLE 2

An ink containing 43 volume percent solids and having the following formulation was made, printed, and fired in general accordance with the procedures of Example 1.

| Tunsten | 87 | wt % |
|---|---|---|
| Alumina | 7 | |
| Nickel | 6 | |

EXAMPLE 3

Co-fired tungsten vias were brush coated with nickel oxide in an acrylic binder solution. The substrate was then heated to 1500° C. for 45 minutes in a 50:50 $H_2/N_2$ atmosphere with a 42° C. dewpoint. Resultant infiltrated vias were leak tested. Vias not hermetic were reworked until hermeticity was achieved utilizing the same above process. No degradation of hermeticity in leak tight vias during rework was observed.

EXAMPLE 4

Co-fired tungsten vias were plated for 30 minutes using an electroless nickel-boron system. Approximately 100 microinch of nickel alloy was deposited on via cover pads. Plated vias were then brush coated with 72 Ag/28 Cu in an acrylic binder solution. The substrate was then heated to 860° C. in 75:25 $H_2/N_2$ with a $-25°$ C. dewpoint. Resultant vias were leak tested and reworked as necessary.

EXAMPLE 5

Co-fired tungsten vias were plated for 30 minutes using an electroless nickel-boron system. Approximately 100 microinch of nickel alloy was deposited on via cover pads. Plated vias were then covered with a preform of 80 Au/20 Cu 0.002 inch thick. The substrate was then heated to 1020° C, in 75:25 $H_2/N_2$ with a $-25°$ F. dewpoint. Resultant vias were leak tested and reworked as necessary.

EXAMPLE 6

Vias were treated in substantial accordance with the procedure of Example 5, except a copper metal paste was used instead of the preform, and the substrate was heated to 1140° C.

EXAMPLE 7

Bore-coated vias containing 69% tungsten, 25% alumina, and 5.3% yttria by volume were electroless nickel plated for 10 minutes. About 50 micro-inches of nickel was deposited. The plated vias were then filled with a thick paste containing a range of 325 mesh to 200 mesh copper powder mixed in an acrylic binder solution. The substrate was heated to 1140° C. in a 75:25 $H_2:N_2$ atmosphere at a dewpoint of $-25°$ C. The resultant vias were helium leak tight.

We claim:

1. A green ceramic body having a substrate with a plurality of via holes, wherein the substrate is composed of alumina, an alumina-based composite, aluminum nitride, beryllia, silicon carbide, or zirconia, and the via holes contain a composition with inorganic constituents consisting essentially of, by weight:

| tungsten | 85-97% |
|---|---|
| alumina | 2-8% | and 1-7% of a metal selected from the group consisting of nickel and palladium, the via holes substantially free of glassy fillers.

2. A green body according to claim 1, wherein the tungsten is in the form of particles having an average size of approximately 0.5-5.0 microns.

3. A green body according to claim 1, wherein the alumina is in the form of particles having an average size of approximately 0.5-5.0 microns.

4. A green body according to claim 1, wherein the metal selected from the group consisting of nickel and palladium is in the form of particles having an average size of approximately 0.5-10 microns.

5. A green body according to claim 1, wherein the composition further comprises less than approximately 2% of an additive selected from the group consisting of cobalt, $Y_2O_3$, and mixtures thereof.

6. A green body according to claim 5, wherein the additive is in the form of particles having an average size of approximately 0.5-10 microns.

7. A fired composite substrate comprising a ceramic and metallized vias, wherein the substrate is composed of alumina, an alumina-based composite, aluminum nitride, beryllia, silicon carbide, or zirconia, and the vias consist essentially of, by weight:

| tungsten | 85-97% |
|---|---|
| alumina | 2-8% | and 1-7% of a metal selected from the group consisting of nickel and palladium, the vias substantially free of glassy fillers.

8. A substrate according to claim 7, wherein the vias are substantially void-free and have a density of greater than approximately 80% theoretical density.

9. A substrate according to claim 8, wherein the vias exhibit a helium leak rate of less than approximately $10^{-9}$ cc/sec.

10. A substrate according to claim 7, wherein the vias have a resistivity less than approximately $4\times10^{-3}$ ohm-centimeters.

11. A substrate according to claim 8, wherein the vias have a resistivity less than approximately $4\times10^{-3}$ ohm-centimeters.

12. A ceramic composite comprising:
(a) a ceramic substrate having less than 1 wt. % of glassy phase and composed of alumina, an alumina-based composite, aluminum nitride, beryllia, silicon carbide, or zirconia, said substrate defining a plurality of vias; and
(b) a conductive material selected from the group consisting of tungsten, molybdenum, and mixtures thereof in association with an infiltrant metal or alloy in at least one via, the vias substantially free of a glassy phase.

13. A composite according to claim 12, wherein the infiltrant metal or alloy is selected from the group consisting of: nickel, palladium, cobalt, cooper, gold, silver and alloys of these materials.

14. A composite according to claim 13, wherein the via is substantially void free and has a density of greater than approximately 90% theoretical density.

15. A composite according to claim 13, wherein the via exhibits a helium leak rate of less than approximately $10^{-9}$ cc/sec.

16. A composite according to claim 13, wherein the vias have a resistivity of less than approximately $6 \times 10^{-4}$ ohm-centimeters.

17. A composite according to claim 13, wherein the vias have a resistivity of less than approximately $4 \times 10^{-4}$ ohm-centimeters.

18. A composite according to claim 13, wherein the vias are ductile.

19. A ceramic composite, comprising:
(a) a ceramic substrate substantially free of a glassy phase and composed of alumina, an alumina-based composite, aluminum nitride, beryllia, silicon carbide, or zirconia, said substrate defining a plurality of bore-coated vias, the vias coated with a conductive material selected from the group consisting of tungsten, molybdenum, and mixtures thereof; and
(b) an infiltrant metal or alloy in association with at least one bore-coated via, the vias substantially free of glassy fillers.

20. A composite according to claim 19, wherein the infiltrant material is selected from the group consisting of: nickel, palladium, cobalt, silver, copper, gold, tungsten, molybdenum, alloys thereof, and mixtures thereof.

21. A composite according to claim 20, wherein the infiltrant material has a thermal expansion approximately equal to that of the substrate.

22. A composite according to claim 20, wherein the vias exhibit a helium leak rate of less than approximately $10^{-9}$ cc/sec.

23. A composite according to claim 20, wherein the vias have a resistivity of less than approximately $6 \times 10^{-4}$.

24. A composite according to claim 20, wherein the vias have a resistivity of less than approximately $4 \times 10^{-4}$.

* * * * *